United States Patent
Smyth et al.

(10) Patent No.: US 7,141,129 B2
(45) Date of Patent: Nov. 28, 2006

(54) ELECTRONIC MODULE INCLUDING A LOW TEMPERATURE CO-FIRED CERAMIC (LTCC) SUBSTRATE WITH A CAPACITIVE STRUCTURE EMBEDDED THEREIN AND RELATED METHODS

(75) Inventors: Thomas Patrick Smyth, Palm Bay, FL (US); Michelle Kay Nelson, Palm Bay, FL (US); Sarah K. Mobley, Palm Bay, FL (US); Charles Michael Newton, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 11/226,565

(22) Filed: Sep. 14, 2005

(65) Prior Publication Data

US 2006/0007636 A1  Jan. 12, 2006

(51) Int. Cl.
*B32B 37/00* (2006.01)
*H01G 4/20* (2006.01)
*H05K 3/30* (2006.01)

(52) U.S. Cl. .............................. 156/89.14; 156/89.16; 156/89.17; 361/321.3

(58) Field of Classification Search ............ 156/89.14, 156/89.17, 89.16; 361/321.3
See application file for complete search history.

(56) References Cited

U.S. PATENT DOCUMENTS

| | | | |
|---|---|---|---|
| 4,729,058 A | 3/1988 | Gupta et al. ................ | 361/321 |
| 5,371,403 A * | 12/1994 | Huang et al. ................ | 257/691 |
| 5,801,108 A | 9/1998 | Huang et al. ................ | 501/32 |
| 5,870,274 A * | 2/1999 | Lucas ......................... | 361/311 |
| 5,876,538 A * | 3/1999 | Steinle et al. ............. | 156/89.16 |
| 5,948,536 A * | 9/1999 | Suzuki et al. ............... | 428/426 |
| 5,953,203 A | 9/1999 | Tormey et al. ............. | 361/313 |
| 6,055,151 A * | 4/2000 | Tormey et al. ............. | 361/313 |
| 6,191,934 B1 | 2/2001 | Liberatore et al. ......... | 361/313 |
| 2002/0025439 A1* | 2/2002 | Ueda et al. ................ | 428/428 |

FOREIGN PATENT DOCUMENTS

| | | | |
|---|---|---|---|
| JP | 1-166599 | * | 6/1989 |
| JP | 1-262695 | * | 10/1989 |
| JP | 6-164150 | * | 6/1994 |
| JP | 8-32242 | * | 2/1996 |
| JP | 8-213755 | * | 8/1996 |
| JP | 9-92978 | * | 4/1997 |
| JP | 2000-58381 | * | 2/2000 |

OTHER PUBLICATIONS

David W. Richerson, "Modern Ceramic Engineering," 1992, Marcel Dekker, Inc., 2nd Edition, pp. 251-270.*

* cited by examiner

*Primary Examiner*—Melvin Mayes
(74) *Attorney, Agent, or Firm*—Allen, Dyer, Doppelt, Milbrath & Gilchrist, P.A.

(57) ABSTRACT

A method for making an electronic module includes forming a low temperature co-fired ceramic (LTCC) substrate with at least one capacitive structure embedded therein. Forming the LTCC substrate may include arranging first and second unsintered ceramic layers and the at least one capacitive structure therebetween. The at least one capacitive structure may include a pair of electrode layers, an inner dielectric layer between the pair of electrode layers, and at least one outer dielectric layer adjacent at least one of the electrode layers and opposite the inner dielectric layer. The at least one outer dielectric layer preferably has a dielectric constant less than a dielectric constant of the inner dielectric layer. The unsintered ceramic layers and the at least one capacitive structure may also be heated, and at least one electronic device may be mounted on the LTCC substrate and electrically connected to the at least one embedded capacitive structure.

20 Claims, 4 Drawing Sheets

ELECTRONIC MODULE INCLUDING A LOW TEMPERATURE CO-FIRED CERAMIC (LTCC) SUBSTRATE WITH A CAPACITIVE STRUCTURE EMBEDDED THEREIN AND RELATED METHODS

FIELD OF THE INVENTION

The present invention relates to the field of electronic modules, and, more particularly, to electronic modules including low temperature co-fired ceramic substrates.

BACKGROUND OF THE INVENTION

Electronic devices are widely used in many types of electronic equipment. Such electronic devices are often grouped together and packaged in a single electronic module. A typical electronic module may include one or more integrated circuits (ICs), such as microprocessors, etc., as well as other discreet components (e.g., resistors, capacitors, etc.) mounted on a substrate, for example. One common material used for making such substrates are low temperature co-fired ceramics (LTCC), for example.

Discreet components may account for 80% or more of the total parts in a given electrical circuit design. While the physical size of the discrete components may be relatively small, the footprint required for their placement may be 2 to 3 times their actual size. This represents a significant portion of the available surface area of the substrate. Continuing demands for higher density packaging and miniaturization trends often require that the available surface area on a substrate be utilized by the most significant parts, such as ICs, for example.

The density limitations of current packaging technology are rapidly being reached. As a result, attempts are being made to incorporate discreet components within the substrate, rather than simply on the surface of the substrate. Yet, it may be difficult to embed discrete components within conventional LTCC materials due to a lack of available dielectric materials with higher dielectric values that are compatible with the substrate, with each other, and with the various metals used in the electronic module.

U.S. Pat. No. 6,191,934 to Liberatore et al. entitled "High Dielectric Constant Embedded Capacitors" discloses a capacitor that may be embedded within a multilayer ceramic circuit board. The capacitor is made using a capacitor ink formulation which provides a dielectric constant in a range of about 2600 to 4500, depending upon the size of the capacitor. The capacitor inks can be screen printed onto a glass-based green tape, or cast as a green tape layer. Electrodes may also be screen printed over and under the capacitor layer or green tape layer.

One limitation of such prior art capacitors is that it may be difficult to route signals near the capacitors because of the high constant dielectric materials used therein. This problem may become particularly acute when numerous capacitive structures are used, potentially resulting in insufficient space for routing the necessary signals.

SUMMARY OF THE INVENTION

In view of the foregoing background, it is therefore an object of the invention to provide an electronic module that includes at least one high capacitance embedded capacitive structure while also providing adequate space for signal routing.

This and other objects, features, and advantages in accordance with the present invention are provided by a method for making an electronic module including forming a low temperature co-fired ceramic (LTCC) substrate with at least one capacitive structure embedded therein. Forming the LTCC substrate may include arranging first and second unsintered ceramic layers and the at least one capacitive structure therebetween. The at least one capacitive structure may include a pair of electrode layers, an inner dielectric layer between the pair of electrode layers, and at least one outer dielectric layer adjacent at least one of the electrode layers and opposite the inner dielectric layer. The at least one outer dielectric layer preferably has a dielectric constant less than a dielectric constant of the inner dielectric layer. Further, forming the substrate may also include heating the unsintered ceramic layers and the at least one capacitive structure. Additionally, the method may include mounting at least one electronic device on the LTCC substrate and electrically connected to the at least one embedded capacitive structure to form the electronic module.

More specifically, the at least one outer dielectric layer may include respective at least one outer dielectric layer adjacent each of the electrode layers and opposite the inner dielectric layer. Each at least one outer dielectric layer may include a first outer dielectric layer and a second outer dielectric layer between the first outer dielectric layer and a respective electrode layer. Further, the second outer dielectric layer may have a greater dielectric constant than a dielectric constant of the first outer dielectric layer. For example, the dielectric constant of the first outer dielectric layer may be in a range of about 7–10, and the dielectric constant of the second outer dielectric layer may be in a range of about 11–17. The inner dielectric layer may have a thickness of less than about 3 mils and a dielectric constant of greater than about 2000.

Forming the LTCC substrate may further include forming at least one signal trace adjacent the at least one outer dielectric layer. The at least one outer dielectric layer and the inner dielectric layer may each include less than about 15% by weight of glass. In addition, the at least one outer dielectric layer may include at least one of CaO, MgO, $ZrO_2$, BaO, and $SiO_2$, and the inner dielectric layer may include $BaTiO_3$, for example. Also, the electrode layers may include at least one of Ag, Au, and AgPd, and the inner dielectric layer may have a thickness of less than about 3 mils.

Conductive vias may also be formed for electrically connecting the at least one electronic device and the at least one embedded capacitive structure. The at least one embedded capacitive structure may advantageously have a capacitive density of greater than about 1000 $pF/mm^2$, and the first and second unsintered ceramic layers and the at least one capacitive structure may be heated at less than about 950° C., for example.

An electronic module according to the present invention includes a low temperature co-fired ceramic (LTCC) substrate, at least one capacitive structure embedded in the LTCC substrate, and at least one electronic device mounted on the LTCC substrate and electrically connected to the at least one embedded capacitive structure. The at least one embedded capacitive structure may include a pair of electrode layers, an inner dielectric layer between the pair of electrode layers, and at least one outer dielectric layer adjacent at least one of the electrode layers and opposite the inner dielectric layer. The at least one outer dielectric layer may have a dielectric constant less than a dielectric constant of the inner dielectric layer.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and the dimensions of layers and regions may be exaggerated in the figures for greater clarity.

Figure 1:
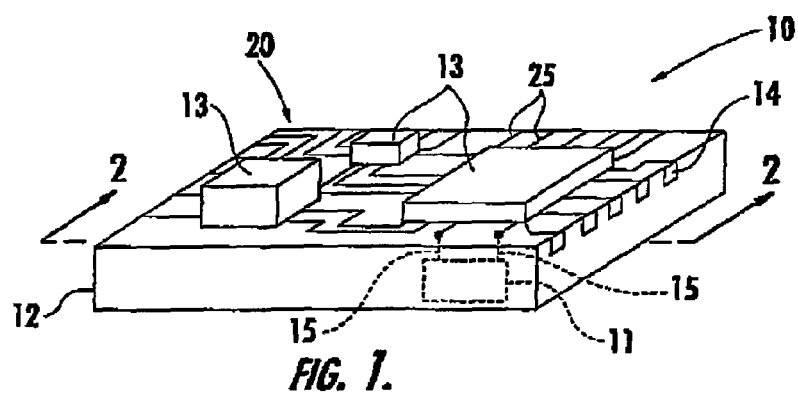
FIG. 1 is a perspective view of an electronic module including an embedded capacitive structure therein according to the invention.
Figure 2:
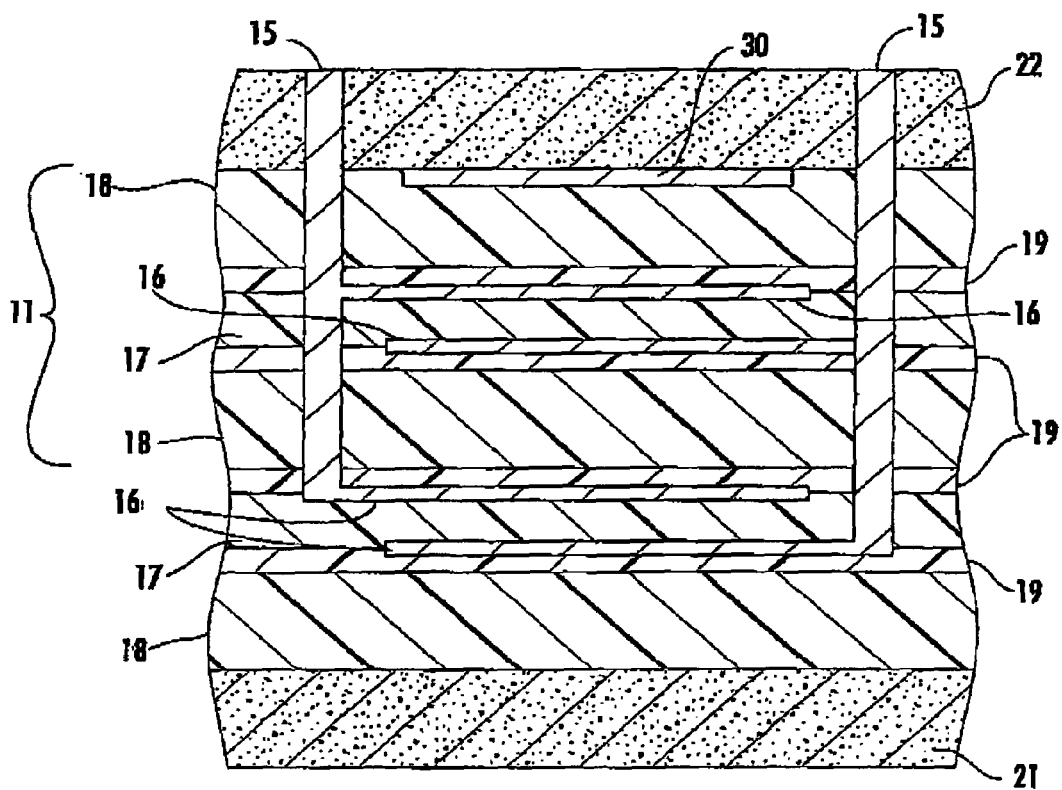
FIG. 2 is a cross-sectional view of the electronic module of FIG. 1 taken along line 2—2.

Referring now to FIGS. 1 and 2, an electronic module 10 according to the invention including at least one embedded capacitive structure 11 is first described. The electronic module 10 includes a low temperature co-fired ceramic (LTCC) substrate 12, for example, in which the capacitive structure 11 is embedded. This material offers advantages in terms of ruggedness, and an ability to form recesses and small stable passageways therein, as well as to provide electrical paths therethrough.

Furthermore, one or more electronic devices 13 may be mounted on a surface 20 of the LTCC substrate 12, for example, as will be appreciated by those skilled in the art. The electronic devices 13 may include semiconductor devices, integrated circuits, heat coils, resistors, etc., for example. Of course, other electronic devices may also be mounted on the electronic module 10. The substrate 12, as best seen in FIG. 1, may carry electrical connectors 14 on at least one of its surfaces. For example, the electrical connectors 14 may be edge connectors for connection to a ribbon type cable, as shown in FIG. 1, for example. Of course, other connectors may also be used, such as pins in a pin grid array, as will be appreciated by those skilled in the art.

The electronic devices 13 may be electrically connected to the at least one embedded capacitive structure 11 by conductive vias 15, for example. As seen in FIG. 2, the embedded capacitive structure 11 may include a pair of electrode layers 16 and an inner dielectric layer 17 therebetween. The inner dielectric layer 17 preferably has a high dielectric constant (K), for example, greater than about 2000, and preferably about 2400 or more, but values less than 2000 could also be used. Because of its high dielectric constant, the inner dielectric layer 17 allows high capacitance values to be achieved with a relatively small surface area and thickness. For example, the dielectric layer 17 may have a thickness of less than about 3 mils, and preferably about 1.5 mils, for example, yet provide a capacitive density of 1000 pF/mm$^2$ or more, as will be discussed further below.

Additionally, more than one capacitive structure 11 may be embedded in the LTCC substrate 12. The capacitive structures 11 may be arranged in a horizontal plane, stacked vertically in an interdigitated fashion, as shown in FIG. 2, or both, for example. As a result, the electronic module 10 may include numerous capacitive structures 11 with only a minimum amount the surface 20 area being required for connection thereto, as will be appreciated by those of skill in the art. Thus, more area of the surface 20 is available for integrated circuits, etc.

Each capacitive structure 11 may further include a respective first outer dielectric layer 18 adjacent each of the electrode layers 16 and opposite a respective inner dielectric layer 17. The dielectric constant of the inner dielectric layer 17 is preferably greater than that of the first outer dielectric layers 18. For example, the dielectric constant of the first outer dielectric layers 18 may be less than about 100 and, more preferably, about 7–10, though other values are also possible. Such a dielectric constant is closely matched to that of typical LTCCs (i.e., ~8), which makes the dielectric layers 18 well suited for routing electrical signals through the substrate 12, as will be appreciated by those of skill in the art. Thus, one or more signal traces 30 may be advantageously be formed adjacent the first outer dielectric layers 18.

Also, the capacitive structure 11 may optionally include a second outer dielectric layer 19 between each first outer dielectric layer 18 and a respective electrode layer 16. The second outer dielectric layers 19 preferably have a dielectric constant greater than that of the first outer dielectric layers 18 and less than that of the inner dielectric layer 17. For example, the dielectric constant of the second outer dielectric layers 19 may again be less than about 100 and, more preferably, in a range of about 11–14. The second outer dielectric layers 19 provide a buffer between the inner dielectric layer 17 and respective first outer dielectric layers 18, which reduces the potential for interactions and provides mechanical reinforcement and improved adhesion.

Figure 3:
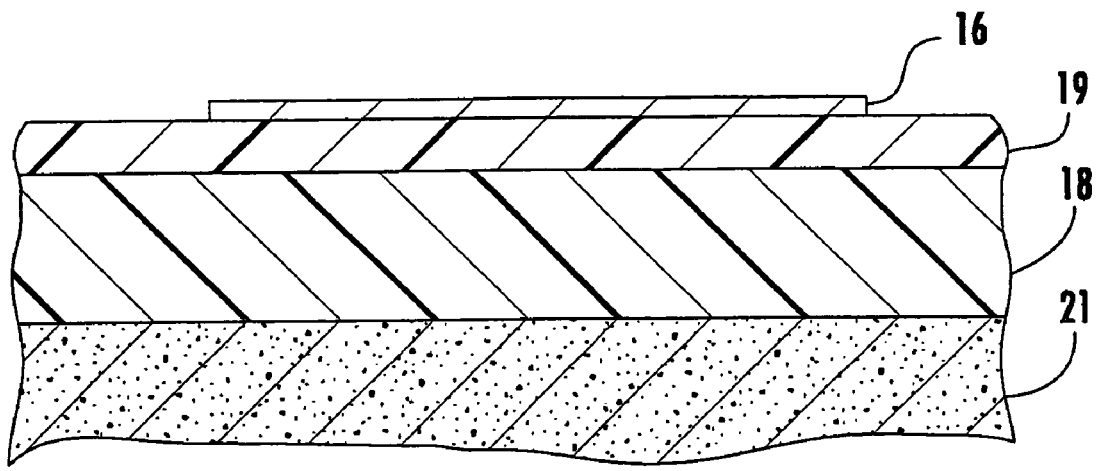
FIGS. 3 and 4 are cross-sectional views also taken along line 2—2 of FIG. 1 and illustrating a method for making the embedded capacitive structure according to the invention.
Figure 4:
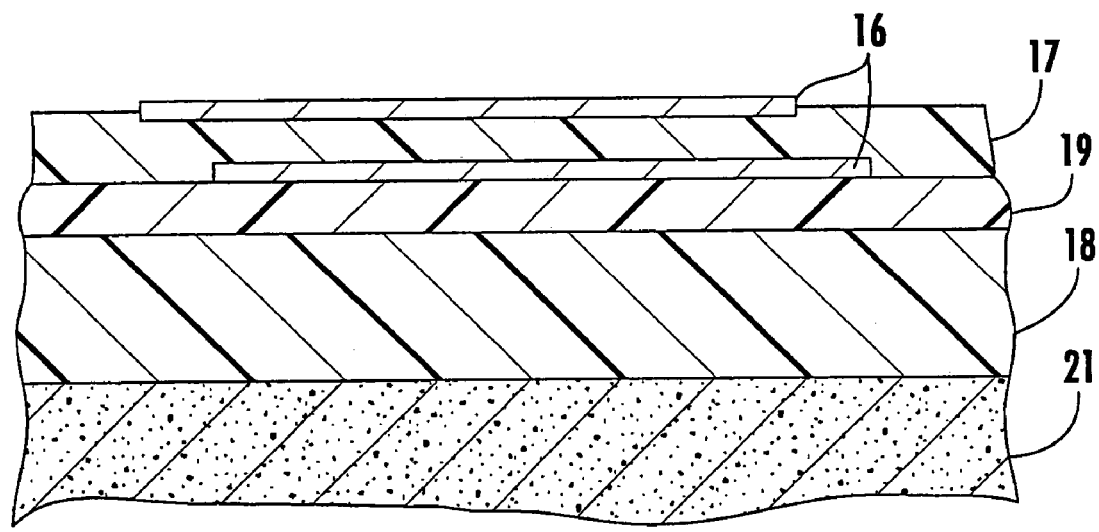

Turning now more particularly to FIGS. 3 and 4, a method for making the electronic module 10 will now be described. The LTCC substrate 12 is formed by arranging the capacitive structures 11 between first and second unsintered ceramic layers 21, 22. More particularly, the first and second outer dielectric layers 18, 19 may be positioned on the unsintered ceramic layer 21. For example, the first and second unsintered ceramic layers 21, 22 may be tape layers, and the dielectric layers 17–19 may also be tape layers. Of course, pastes or other suitable delivery methods for the various materials may also be used, as will be appreciated by those of skill in the art.

A first one of the pair of electrode layers 16 is positioned on the dielectric layer 19, as seen in FIG. 3. The electrodes 16 may be screen printed, for example, and may include at least one of Ag, Au, and AgPd, though other suitable materials may also be used. The inner dielectric tape layer 17 is positioned on the electrode layer 16, and the second one of the pair of electrode layers 16 is positioned thereon, as shown in FIG. 4. Another second outer dielectric tape layer 19 may then be positioned on the stack, followed by another first outer dielectric tape layer 18 (FIG. 2).

Of course, additional dielectric layers 17–19 and electrode layers 16 may be assembled to form the interdigitated structure shown in FIG. 2. The second unsintered ceramic layer 22 may then be positioned on the capacitive structure (or structures) 11, and the stack may be laminated and heated to sinter and form the substrate 12. Additional dielectric layers may also be used as necessary in particular applications, as will be appreciated by those of skill in the art.

The conductive vias 15 may be formed using standard techniques and are preferably made from the same materials as the electrode layers 16, for example. Signal traces 25 may also be formed on the surface 20 of the electronic module 10 (e.g., by screen printing, etc.), and one or more of the electronic devices 13 may be mounted on the surface 20 and electrically connected to the conductive vias 15 and signal traces.

Of course, it will be appreciated by those of skill in the art that the conductive vias 15 may be formed during the arrangement of the various layers of the capacitive structure 11. Furthermore, the capacitive structure need not be formed directly on the first unsintered ceramic layer 21. Rather, the capacitive structure (or structures) 11 may be formed separately and then stacked between the first and second unsintered ceramic layers 21, 22.

Additional details and features of the embedded capacitive structure 11 will now be described with reference to an example thereof fabricated according to the invention.

EXAMPLE

Several multilayer capacitive structures 11 were fabricated according to the invention using a system of ultra-low firing temperature COG and X7R dielectric compositions from Ferro Electronic Materials of Penn Yan, N.Y. (hereafter "Ferro"). The embedded capacitive structures were designed to include a high-K (~2400) inner dielectric layer 17 in a low-K (~10) dielectric package (i.e., the second outer dielectric layers 18) made from the above ultra-low firing dielectrics. These dielectrics fire at temperatures below 950° C. and are compatible with standard gold metallization systems. The combination of dielectrics provided a capacitive structure 11 that was comparable to current LTCC systems and well suited for integration into IC packaging or discrete, multi-function passive component applications.

The test structures were 58 cm$^2$ and were fabricated and analyzed for material interaction and electrical performance. Capacitance densities greater than 1500 pF/mm$^2$ were attained, as will be discussed further below. The test structures were also made using existing LTCC processing technology. More specifically, standard tape casting, lamination and metallization methods were used, thus providing for cost effective manufacture of the capacitive structures 11 and electronics module 10.

The Ultra-Low Fire series of X7R and COG dielectrics by Ferro includes both low-K materials (K~10–14), which were used for the first and second outer dielectric layers 18, 19, and the high-K (K~2400, X7R) capacitor dielectrics which were used for the inner dielectric layer 17. Although these compositions densify at temperatures below 950° C., they are not ceramic filled or recrystallizing glass materials. Rather, they are polycrystalline ceramics with less than 15 wt. % glass forming constituents to promote densification by liquid phase sintering. Further, they are compatible with low resistivity, high Ag content and Au metal systems.

The physical property characteristics for the three dielectric compositions used are given in Table 1, below. The K10 and K14 dielectrics respectively used for the first and second outer dielectric layers 18, 19 were CaO—MgO—ZrO$_2$—SiO$_2$ based compositions. Further, CaO—MgO—ZrO$_2$—BaO—SiO$_2$ based compositions may also be used, for example. The K2400 dielectric used for the inner dielectric layer 17 was a doped barium titanate (BaTiO$_3$) based X7R formulation. To achieve the ultra-low firing behavior, the median particle sizes were kept small and the distributions very narrow, making corresponding surface areas higher than typical dielectric compositions.

TABLE 1

| | Powder Physical Properties | | | | |
|---|---|---|---|---|---|
| Material | Median Particle Size (mm) | Surface Area (m$^2$/g) | Density (g/cm$^3$) | Tap Density (g/cm$^3$) | LOI (wt. %) |
| K10 | 0.7 | 12.4 | 3.2 | 0.60 | 1.6 |
| K14 | 0.9 | 5.9 | 4.4 | 0.85 | 0.5 |
| K2400 | 0.8 | 4.0 | 6.0 | 1.4 | 0.6 |

The above dielectric materials are produced on a large scale as deagglomerated powders that can be directly dispersed in a suitable organic binder system for tape casting. Adjustments to compensate for the higher powder surface area effect on tape casting slip rheology are accomplished by the correct selection of dispersant chemistry, order and method of addition and volume concentration, as will be appreciated by those of skill in the art. The tape system used for the test structures, provided by Ferro, are described below in further detail.

Figure 5:
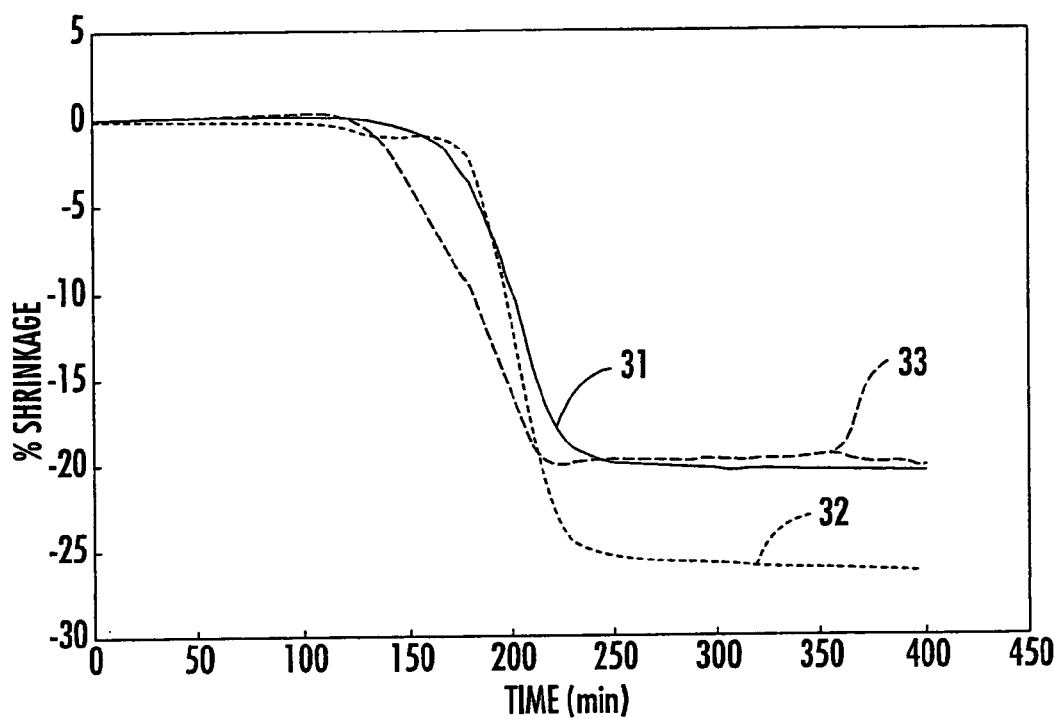
FIG. 5 is a graph of material shrinkage versus time for various dielectric materials used for making embedded capacitive structures according to the invention.
Figure 6:
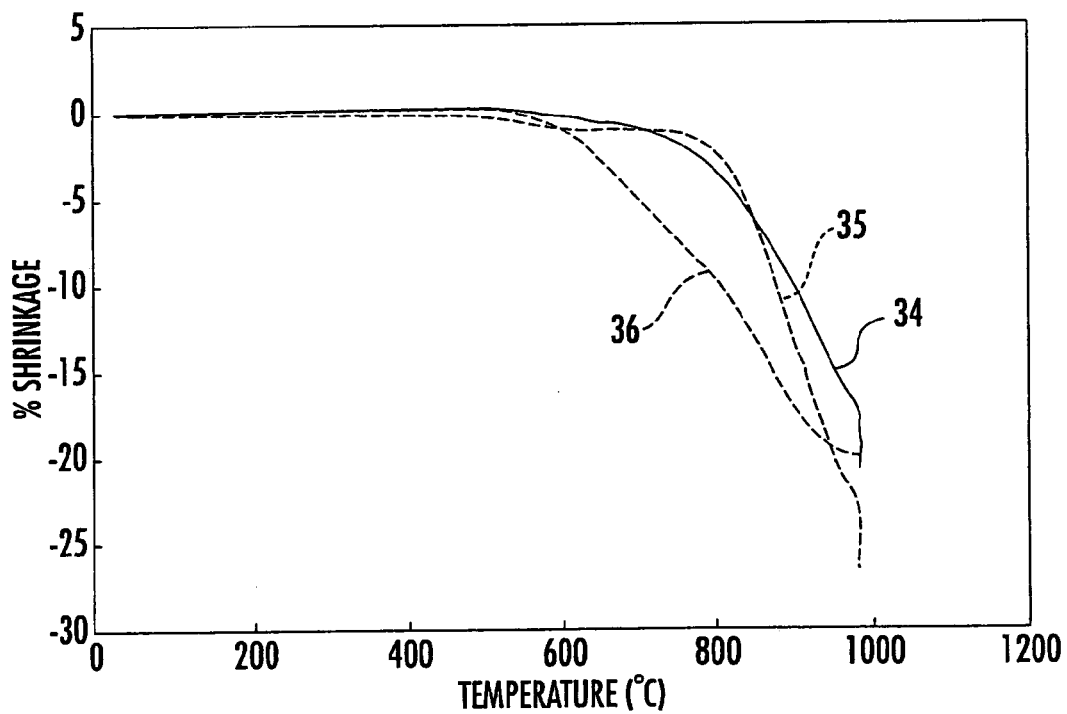
FIG. 6 is a graph of material shrinkage versus temperature for the dielectric materials used for making embedded capacitive structures according to the invention.

A comparison of the densification behavior of the three dielectric compositions, i.e., K10, K14, and K2400, are illustratively shown in FIGS. 5 and 6. The lines 31–33 respectively correspond to the K10, K14, and K2400 materials in FIG. 5, and the lines 34–36 respectively correspond to the K10, K14, and K2400 materials in FIG. 6. The test structures were prepared as tape cast laminates with a geometry of 12×12×1 mm, though other geometries may also be used. As may be seen, the onset of densification occurs between 500 and 600° C., while the most rapid densification takes place between 750 and 900° C. Mismatch between the densification rates and total shrinkage of the dielectrics can also be seen in these figures. Selection of proper cofiring profile allowed for successful fabrication of composite structures, as will be appreciated by those of skill in the art.

Electrical property measurements were performed on each dielectric material using both bulk ceramic and standard 1206 size MLCC configurations. Dielectric constant, dissipation factor and transmission coefficient were characterized on bulk specimens using a Kent resonant mode dielectrometer. One port and 2-port cavity perturbation methods were used to measure Q*f and $t_f$ values. Table 2 provides a summary of the low frequency MLCC test results for parts fired at various temperatures.

TABLE 2

Electrical Data Summary for Individual Dielectric Materials in MLCC Form.

| Material | Firing Temp (° C.) | Cap (pF) | K | MHz DF (%) | MHz Q (%) | TCC (ppm/° C.) −55° C. | 85° C. | 125° C. |
|---|---|---|---|---|---|---|---|---|
| K10 | 900 | 28.4 | 9 | 0.001 | 84600 | +134 | +121 | +119 |
|  | 920 | 29.1 | 9 | 0.001 | 104370 | +134 | +121 | +119 |
|  | 940 | 29.4 | 9 | 0.003 | 3876 | +132 | +120 | +121 |
| K14 | 880 | 48.1 | 13 | 0.005 | 44315 | 0 | +1 | +6 |
|  | 900 | 49.7 | 14 | 0.001 | 29890 | −9 | −4 | +1 |
|  | 920 | 50.0 | 14 | 0.001 | 37020 | −16 | −8 | −3 |
| K2400* | 880 | 151.2 | 2338 | 1.49 | N/A | −10 | −2 | −2 |
|  | 900 | 157.7 | 2378 | 1.49 | N/A | −10 | −5 | −6 |

*TCC Reported in %/° C.

The data in Table 2 was generated at 1 MHz using a HP 4278A capacitance meter and a HP 16034E test fixture. The temperature coefficient measurements were performed using an Ingalls Engineering model IE-TCM-80 temperature chamber and capacitance test system using a 1 KHz test frequency. High frequency test results for the low-K materials are shown in Table 3. In their individual forms, the K10 and K2400 dielectrics provide acceptable COG and X7R performance, respectively, while the K10 data illustrates this material's suitability as a low-K, low-loss substrate dielectric.

TABLE 3

High Frequency Electrical Data Summary for Bulk Ceramic Samples

| Material | Firing Temp (° C.) | Fired Density (g/cm$^3$) | $\epsilon'$ | tan δ (%) | Q*f (GHz) | $\tau_f$* (ppm/° C.) |
|---|---|---|---|---|---|---|
| K10 | 900 | 4.26 | 8.3 | 0.083 | 11215 @ 9.3 GHz | −23.8 |
| K14 | 900 | 3.25 | 13.4 | 0.14 | 6250 @ 8.8 GHz | −10.6 |

*−20 to +80 C.

In the fabricated devices, the K10 materials were used for the first outer dielectric layers 18 to allow for conventional signal and power/ground planes, as needed. The inner dielectric layer 17 made of the K2400 material was "sandwiched" between a second outer dielectric layer 19 of K14 material. As noted above, the K14 material provides a buffer layer between the K10 and K2400 materials, reducing the potential for interactions and providing mechanical reinforcement and improved adhesion.

Baseline capacitor plate areas and geometries were calculated using the following formula:

$$C = \frac{0.244 \cdot K \cdot S(n-1)}{d}$$

where K is the dielectric constant, S is the plate area, d is the plate thickness, and n is the number of layers. Embedded capacitive structures 11 with capacitances of 0.01, 0.015, 0.02, 0.1, 0.15, and 0.2 µF were designed and produced.

A modified tape transfer manufacturing process was used to fabricate the test structures. Dielectric tape was cast on a Mylar carrier film using a floating doctor blade, and the tape thickness used was 25 µm for the K10 & K14 materials and 14 µm for the K2400 material. Internal conductors were deposited using a vision aligned screen printer. A PVB binder system, Ferro B74001, along with Ferro modifiers M1125 and M1135 were used with binder solids loading adjusted for each dielectric composition to help match green and fired shrinkage characteristics.

Moreover, Ferro "fritless" Au internal conductors were used to construct the embedded capacitor structure 11. The conductive vias 15 were formed by laser drilling, and the holes were filled using conventional LTCC methods. Lamination was performed in a heated isostatic press. Final lamination time, pressure and temperatures were comparable to conventional LTCC processing. The test structures were fired on stabilized zirconia setters and uniaxially constrained with a load suitable to maintain flatness during sintering. Following sintering, Au metallization was printed on the surface to provide contact with the embedded components.

To understand the interactions taking place between dielectrics and the conductors during co-firing, a detailed microstructure analysis was conducted using a JEOL scanning electron microscope (SEM) in both secondary and backscatter detection modes with a PGT energy dispersive X-ray analyzer (EDAX). The test structure used a Ag/Pd (90:10) electrode system and demonstrated the ability to sandwich a high-K dielectric between layers of low-K material.

Figure 7:
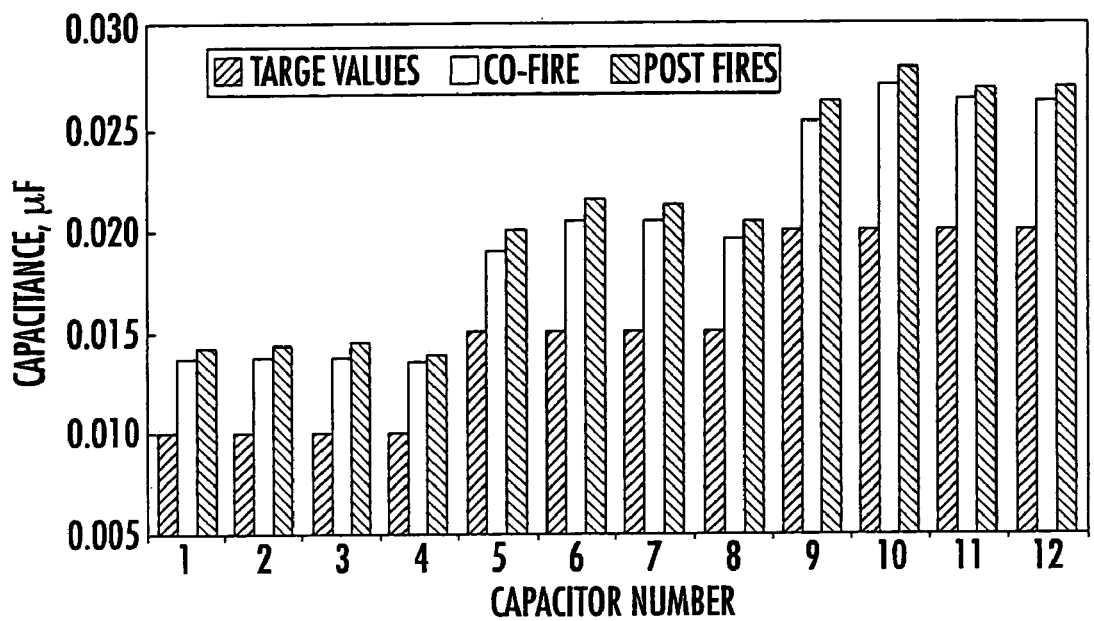
FIG. 7 is a bar graph of measured capacitance values for twelve different embedded capacitive structures made according to the invention.
Figure 8:
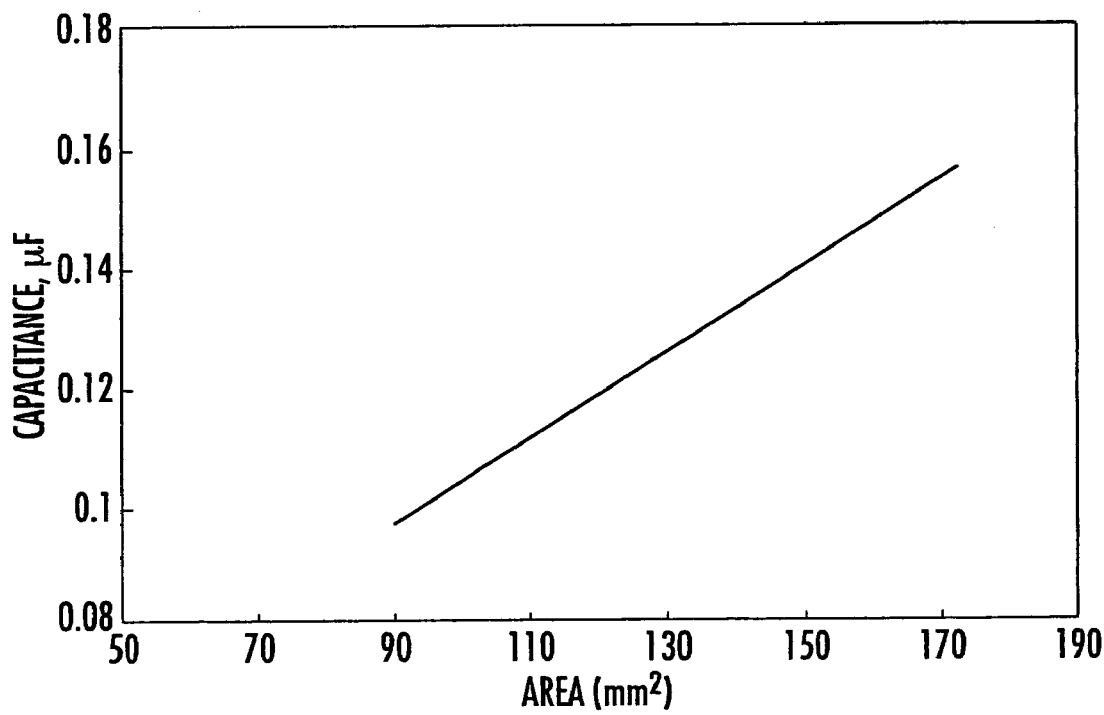
FIG. 8 is a graph plotting the measured capacitance values of FIG. 7 versus surface area.

Capacitance was measured using a calibrated hand held Tenma meter directly probing the conductive vias 15 after the initial firing cycle. Post fire surface metallization was added, and the structures were processed through a standard 850° C., 10 minute dwell firing cycle. Capacitance was again measured utilizing the same equipment. Results of this testing are presented in FIGS. 7 and 8. As may be seen, high capacitance densities were achieved in these structures. The embedded capacitive structures 11 had values close to the design capacitance and showed no significant degradation after a second firing cycle.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that other modifications and embodiments are intended to be included within the scope of the appended claims.

That which is claimed is:

1. A method for making an electronic module comprising:
   forming a low temperature co-fired ceramic (LTCC) substrate with at least one capacitive structure embedded therein by,
   arranging first and second unsintered ceramic layers and the at least one capacitive structure therebetween, the at least one capacitive structure comprising a pair of electrode layers, an inner dielectric layer between the pair of electrode layers, a first outer dielectric layer adjacent at least one of the electrode layers and opposite the inner dielectric layer, and a second outer dielectric layer between the first outer dielectric layer and the at least one electrode layer, the inner dielectric layer having a greater dielectric constant than a dielectric constant of the second dielectric layer, and the dielectric constant of the second outer dielectric layer being greater than a dielectric constant of the first outer dielectric layer, and
   heating the unsintered ceramic layers and the at least one capacitive structure; and
   mounting at least one electronic device on the LTCC substrate and electrically connected to the at least one embedded capacitive structure to form the electronic module.

2. The method of claim 1 wherein the first and second outer dielectric layers comprises respective first and second outer dielectric layers adjacent each of the electrode layers and opposite the inner dielectric layer.

3. The method of claim 1 wherein the dielectric constant of the first outer dielectric layer is in a range of about 7–10, and the dielectric constant of the second outer dielectric layer is in a range of about 11–17.

4. The method of claim 1 wherein the inner dielectric layer has a dielectric constant of greater than about 2000.

5. The method of claim 1 wherein forming the LTCC substrate further comprises forming at least one signal trace adjacent the first outer dielectric layer.

6. The method of claim 1 wherein each of the first outer dielectric layer, the second outer dielectric layer, and the inner dielectric layer comprises less than about 15% by weight of glass.

7. The method of claim 1 wherein each of the first and second outer dielectric layers comprises at least one of CaC, MgO, $ZrO_2$, BaO, and $SiO_2$.

8. The method of claim 1 wherein the inner dielectric layer comprises $BaTiO_3$.

9. The method of claim 1 wherein the electrode layers comprise at least one of Ag, Au, and AgPd.

10. A method for making an electronic module comprising:
    forming a low temperature co-fired ceramic (LTCC) substrate with at least one capacitive structure embedded therein by
    arranging first and second unsintered ceramic layers and the at least one capacitive structure therebetween, the at least one capacitive structure comprising a pair of electrode layers, an inner dielectric layer between the pair of electrode layers, and first and second outer dielectric layers adjacent at least one of the electrode layers and opposite the inner dielectric layer, the second outer dielectric layer between the first outer dielectric layer and a respective electrode having a greater dielectric constant than a dielectric constant of the first outer dielectric layer, the first and second outer dielectric layers having respective dielectric constants less than a dielectric constant of the inner dielectric layer, and
    heating the unsintered ceramic layers and the at least one capacitive structure;
    mounting at least one electronic device on the LTCC substrate and electrically connected to the at least one embedded capacitive structure to form the electronic module; and
    forming conductive vias for electrically connecting the at least one electronic device and the at least one embedded capacitive structure.

11. The method of claim 10 wherein the dielectric constant of the first outer dielectric layer is in a range of about 7–10, and the dielectric constant of the second outer dielectric layer is in a range of about 11–17.

12. The method of claim 10 wherein the inner dielectric layer has a dielectric constant of greater than about 2000.

13. The method of claim 10 wherein forming the LTCC substrate further comprises forming at least one signal trace adjacent the first outer dielectric layer.

14. The method of claim 10 wherein the first and second outer dielectric layers and the inner dielectric layer each comprises less than about 15% by weight of glass.

15. The method of claim 10 wherein the first and second outer dielectric layers comprises at least one of CaO, MgO, $ZrO_2$, BaO, and $SiO_2$.

16. The method of claim 10 wherein the inner dielectric layer comprises $BaTiO_3$.

17. The method of claim 10 wherein the electrode layers comprise at least one of Ag, Au, and AgFd.

18. The method of claim 10 wherein the inner dielectric layer has a thickness of less than about 3 mils.

19. The method of claim 10 wherein the at least one capacitive structure has a capacitive density of greater than about 1000 $pF/mm^2$.

20. The method of claim 10 wherein heating the unsintered ceramic layers and the at least one capacitive structure comprises heating at less than about 950° C.

* * * * *

UNITED STATES PATENT AND TRADEMARK OFFICE
CERTIFICATE OF CORRECTION

PATENT NO. : 7,141,129 B2
APPLICATION NO. : 11/226565
DATED : November 28, 2006
INVENTOR(S) : Smyth et al.

It is certified that error appears in the above-identified patent and that said Letters Patent is hereby corrected as shown below:

| | |
|---|---|
| On the Title page Item (63) | Insert -- Related U.S. Application Data<br><br>Divisional of application no. 10/022,595, filed on December 13, 2001. -- |
| Column 6, Line 55 | Delete: "cofiring"<br>Insert -- co-firing -- |
| Column 9, Line 45 | Delete: "CaC"<br>Insert -- CaO -- |
| Column 10, Line 44 | Delete: "AgFd"<br>Insert -- AgPd -- |

Signed and Sealed this

Twenty-sixth Day of June, 2007

JON W. DUDAS
*Director of the United States Patent and Trademark Office*